(12) United States Patent
Eriksson

(10) Patent No.: US 8,704,585 B2
(45) Date of Patent: Apr. 22, 2014

(54) METHOD FOR FORMING AN ELECTRIC SIGNAL REPRESENTING A SOUND AND A DEVICE THEREFOR

(75) Inventor: Sven-Ake Eriksson, Siljansans (SE)

(73) Assignee: Research Electronics Leksand AB, Siljansnäs (SE)

( * ) Notice: Subject to any disclaimer, the term of this patent is extended or adjusted under 35 U.S.C. 154(b) by 0 days.

(21) Appl. No.: 13/976,684

(22) PCT Filed: Dec. 22, 2011

(86) PCT No.: PCT/SE2011/051576
§ 371 (c)(1),
(2), (4) Date: Jun. 27, 2013

(87) PCT Pub. No.: WO2012/091662
PCT Pub. Date: Jul. 5, 2012

(65) Prior Publication Data
US 2013/0278299 A1    Oct. 24, 2013

(30) Foreign Application Priority Data
Dec. 28, 2010   (SE) ...................................... 1051380

(51) Int. Cl.
*H03K 17/687* (2006.01)
(52) U.S. Cl.
USPC ........... 327/430; 327/427; 327/108; 330/277; 318/120
(58) Field of Classification Search
USPC .................. 327/108, 427, 430, 434; 330/277; 318/120
See application file for complete search history.

(56) References Cited

U.S. PATENT DOCUMENTS

| 3,993,869 A | 11/1976 | Kono et al. |
| 4,037,169 A | 7/1977 | Suzuki |
| 4,405,832 A | 9/1983 | Sondermeyer |
| 5,498,997 A | 3/1996 | Schiebold |
| 8,126,165 B2 * | 2/2012 | Kondo et al. ................. 381/113 |
| 8,587,378 B2 * | 11/2013 | Khandavalli ................. 330/292 |
| 2008/0008335 A1 | 1/2008 | Mate |
| 2008/0278242 A1 * | 11/2008 | Hsu et al. ...................... 330/296 |
| 2009/0141909 A1 | 6/2009 | Van Katz et al. |

FOREIGN PATENT DOCUMENTS

GB   2274367 A   7/1994

* cited by examiner

*Primary Examiner* — Quan Tra
(74) *Attorney, Agent, or Firm* — Browdy and Neimark, PLLC

(57) ABSTRACT

A method for driving a field effect transistor for shaping an electrical signal, representing a sound, to an output signal is disclosed. The method comprises modifying the input signal to an intermediate signal, and output of the intermediate signal to the field effect transistor for shaping the output signal. The method comprises the steps of adjusting the quiescent point of the field effect transistor such that the same is placed in the quadratic region of the transfer characteristics of the field effect transistors, and adjusting the amplitude of the intermediate signal, such that the same causes the potential swing between the gate terminal and the source terminal to at least partly be in the quadratic region of the transfer characteristics of the field effect transistor.

8 Claims, 4 Drawing Sheets

METHOD FOR FORMING AN ELECTRIC SIGNAL REPRESENTING A SOUND AND A DEVICE THEREFOR

TECHNICAL FIELD

The present invention relate in a first aspect to a method for driving a field effect transistor for forming an electrical input signal, representing a sound, to an output signal, which method comprises modifying the input signal to an intermediate signal and output of the intermediate signal to the field effect transistor for forming the output signal.

In a second aspect the present invention relates to a device configured for executing said method.

BACKGROUND

A musical system such as a system for recording, playing, amplifying a string instrument, comprises a string instrument equipped with microphones and an amplifier and finally loudspeakers for sound generation.

The amplifier in such a system will affect the perceived sound of the listener/musician due to non-linearity of the amplifier used in the reproduction of the signal from the microphone. In the earliest known amplifier technology radio tubes were used. These early amplifiers based on radio tubes are perceived by many listeners as superior to modern amplifiers based on semiconductor technology. The main cause of audible differences between tube based amplifiers and previously known semiconductor amplifiers are the differences in the non-linearity involved.

Tube based amplifiers in general have high supply voltages and output transformers for transforming the impedance to the loudspeaker. Radio tubes are also relatively expensive and are mechanically fragile; also the availability of good radio tubes becomes more and more limited. The necessary output transformers are also relatively expensive and heavy.

Therefore, it is desirable to mimic the sound shaping properties of the radio tube by using modern semiconductor components. This has been done in several earlier attempts which can be divided into two main groups of amplifiers.

The first type of amplifiers uses standard discrete components that utilize some nonlinearity effect of semiconductors. As an example of this can GB 2274367A be pointed out, which uses high voltage MOSFET (Metal Oxide Semiconductor Field Effect Transistors) transistors. Also U.S. Pat. No. 4,405,832A discloses a sound shaping stage that aims to mimic the distorted sound of a tube amplifier by means of operational amplifiers and diodes.

In the first group belong also amplifiers disclosed on the internet in forums for guitar enthusiasts. Among these the so called "Fetzer Valve" (see http://www.runoffgroove.com/fetzervalve.com) can be found. This amplifier is equipped with a copy of the input stage of a Fender tube amplifier, replacing the radio tubes with JFET transistors. The idea behind this amplifier is based on the understanding that a JFET transistor and a radio tube exhibit similar type of non-linearity. However, there are several disadvantages with the "Fetzer Valve" design; the most serious disadvantage from a production point of view is that the amplifier must be manually adjusted with potentiometers for obtaining desired properties. Another disadvantage is that the potential of the gate terminal is adjusted with an auto-bias design. The auto-bias causes the design to become sensitive for intrinsic variations of the field effect transistor.

Another amplifier is the "Tillman"-preamplifier published in the Usenet discussion forum alt.guitar on the Sep. 28, 1992. The "Tillman" amplifier also uses a JFET transistor and an auto-bias of the potential of the gate terminal.

The other group of amplifier uses digital sound processing to mimic the tube sound. The digital sound processing is performed by digitalization of the input signal from the microphones of the guitar; the digital signal is then fed to a digital signal processor, which processes the digital signal according to a program. The program is designed to emulate the non-linearity that the tube amplifier exhibits. As an example of this can the U.S. Pat. No. 5,789,689 be pointed out.

SUMMARY

The purpose of the invention is to accomplish a shaping of an electrical signal representing a sound, which shaping aims to emphasize the nonlinear reproduction of sound that the human ear finds pleasant.

The object of the invention is attained by the first aspect of the invention by a method of the initially defined type comprising the special actions for driving a field effect transistor, which actions are:
configuring the quiescent point of the field effect transistor such that the same is placed in the quadratic region of a transfer characteristic of the field effect transistor by adjusting the potential between a gate terminal and a source terminal of the field effect transistor by means of the direct-current voltage level of the intermediate signal and the potential of the source terminal of the field effect transistor,
adjusting the amplitude of the intermediate signal such that the same causes the potential swing between the gate terminal and the source terminal to at least partly be in the quadratic region of the transfer characteristics of the field effect transistor.

By selecting a quiescent point in the quadratic region of the transfer characteristics of the field effect transistor will the part of the transfer characteristics that closely resembles the transfer characteristics of a radio tube be used, wherein a preferred sound shaping is obtained.

When a signal is superposed on the intermediate signal the potential between the gate terminal and the source terminal of the field effect transistor will vary. By ensuring that this amplitude at least partly operates in the quadratic region of the field effect transistor it is ensured that a tube-like sound always is obtained. This tube-like sound is characterized in that it contains the distortion produced by the quiescent point of the transistor in the quadratic region.

According to a preferred embodiment of the method the amplitude of the intermediate signal is adjusted to be lower than the threshold voltage of the field effect transistor.

By going below the threshold voltage of the field effect transistor the transistor will cut-off, whereby the output signal is clipping in a hard manner. This hard clipping is perceived by the listener as the characteristic distorted sound of an overdriven tube amplifier.

According to another preferred embodiment of the inventive method, the method comprises the steps of:
limiting the minimum potential between the drain terminal and the source terminal of the field effect transistor by means of at least one impedance arranged at at least the drain terminal of the same, which impedance causes the maximum driveable current that the field effect transistor can drive in the circuit without saturation of the transistor, arranging a resistor in series with the output of the modifying means and the gate terminal of the field effect transistor, adjusting the amplitude of the intermediate signal so that it causes the potential between the gate terminal and source terminal to reach a value that at least corresponds to the maximum possible drain current in the circuit.

By these method steps the technical effect of soft clipping is achieved which is a desirable property of a tube-like sound.

In the case when the method comprises the step of:
arranging a diode between the gate terminal of the field effect transistor and a potential,
the technical effect of soft clipping is achieved with the possibility to control the level for entering soft clipping.

The second aspect of the invention is attained by a device arranged for executing the method comprising the special features described in dependent device claims.

BRIEF DESCRIPTION OF THE DRAWINGS

The invention is described in more detail by the following detailed description of embodiments of the invention with reference to the appended drawings.

DETAILED DESCRIPTION

It shall be pointed out that the drawings are schematic with the sole purpose of exemplifying the inventive idea according to the detailed description and accompanying claims. The invention shall therefor not be considered to be limited to the shown schematic figures.

Figure 1:
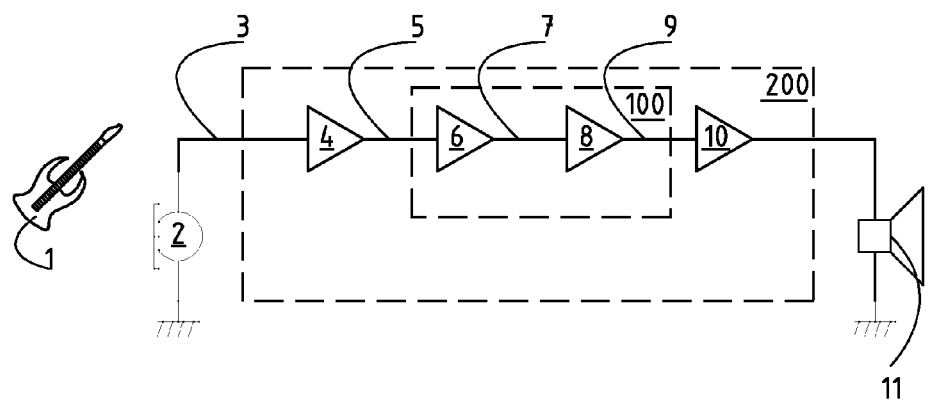
FIG. 1 shows a block diagram of an exemplary sound reproduction system comprising sound shaping stages for clean tube-like sound and a sound shaping stage for hard or soft clipping distorted tube-like sound, respectively.

Initially, a music system for reproducing sound from for example an electric guitar 1 is disclosed in FIG. 1. The sound signals are captured by a microphone 2, wherein the weak signals therefrom forms an input signal 3 to an amplifier 200. In the amplifier 200 the weak input signal 3 is amplified by a sound shaper for a clean tube-like sound 4 to a sound shaper input signal 5, which is fed to a sound shaping stage 100. The sound shaper for clean tube-like sound 4 exhibits most preferably nonlinearities resembling the non-linearity of radio tubes.

In the sound shaping stage 100 the sound shaper input signal 5 is first modified by means of a modifying means 6, this modified input signal is designated the intermediate signal 7. The actual sound shaping of the intermediate signal 7 aiming to provide soft and hard distortion is performed in a sound shaping stage 8, forming the output signal 9. The output signal 9 is fed to a power amplifier 10 that in turn drives the loudspeaker 10 for sound generation.

Figure 2:
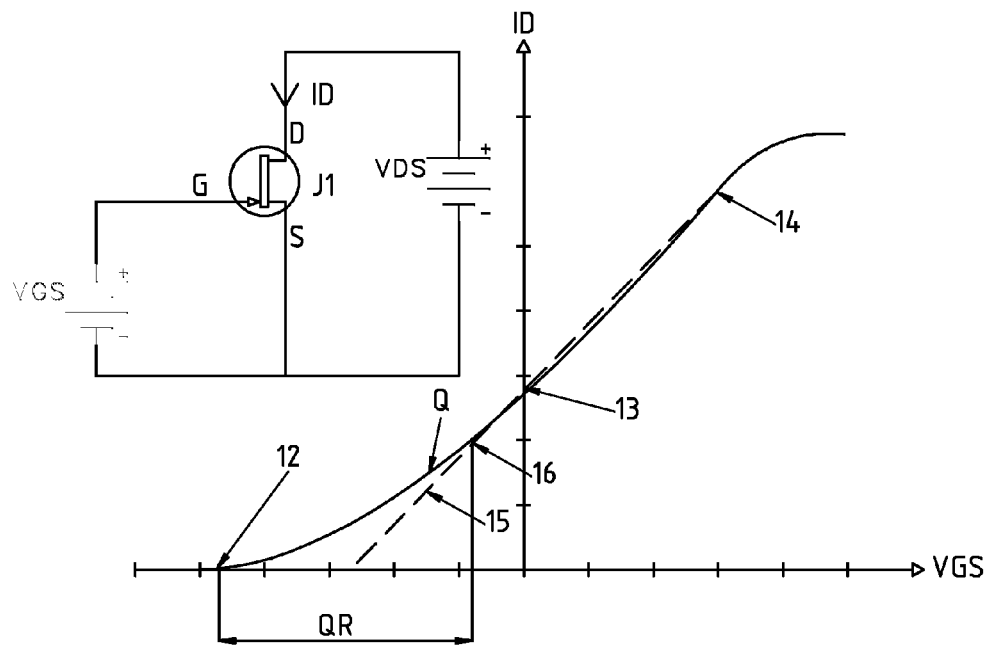
FIG. 2 shows the transfer characteristics for a common field effect transistor of depletion type.

FIG. 2 shows the transfer characteristics for a JFET (Junction Field Effect Transistor) of depletion type J1, which transfer characteristics shows the drain current ID as a function of the potential difference VGS between the gate terminal G and the source terminal S of the field effect transistor for a given potential difference VDS between the drain terminal D and the source terminal S of the transistor J1. Based on this diagram the voltage 12 at which the drain current ID asymptotically approaches the horizontal axis VGS is defined. This voltage 12 is designated threshold voltage. When the potential difference VGS between the gate terminal G and the source terminal S is 0 volt the saturation current 13 is defined. An increasing potential VGS finally causes the intrinsic diode in the transistor J1 between the gate terminal and the source terminal to reach its threshold voltage 14, wherein the intrinsic gate-source diode begins to conduct current with an exponential dependency on the applied potential.

By studying the transfer characteristics of a JFET it is realized that the same to a large extent resembles the transfer characteristics of a radio tube. Especially in the quadratic region the JFET transistor exhibits a transfer characteristic that is almost identical to the transfer characteristics of a radio tube. The quadratic region is defined as the interval between the threshold voltage 12 and a voltage 16. The voltage 16 can be seen as the voltage when the transfer characteristics deviate from a linear fit 15 of the same in the linear region. By adjusting the quiescent point Q of a JFET to be in the interval defined between the threshold voltage 12 and the voltage 16 the non-linearity of the JFET transistor to a large extent will correspond to the non-linearity exhibited by radio tubes.

Figure 3:
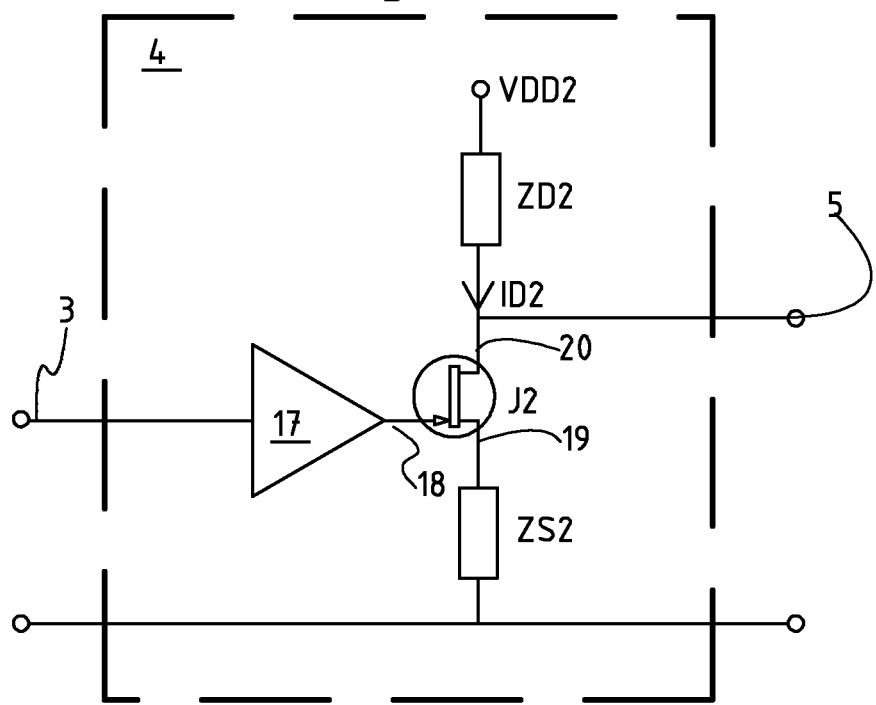
FIG. 3 shows a schematic sound shaping stage for clean tube-like sound.

FIG. 3 shows the inventive sound shaper for clean tube-like sound 4. The input signal 3 from the microphone 2 is fed to a bias stage 17, which adjusts the DC-level of the incoming signal and forms an intermediate signal 18 for output to a gate terminal of a JFET transistor J2. The transistor J2 is fed by a supply voltage VDD2 via an impedance ZD2 to the drain terminal 20 thereof. The source terminal 19 is connected to ground potential via an impedance ZS2.

The quiescent point for the JFET transistor J2 is in the quadratic region QR, which is defined as the interval from the threshold voltage 12 to the voltage 16, see FIG. 2. This quiescent point is obtained by supplying the gate terminal 18 of the transistor J2 with a suitable potential with respect to the source terminal 19. Most preferred the potential is obtained at 20% of the maximum drain current of the transistor J2. This drain current results in that the quiescent point Q of the transistor always is in the quadratic region.

A well-known problem with the adjustment of the quiescent point for a JFET transistor is that the characteristics of the same are spread a lot between different transistors of the same type. For example the saturation current 13 in FIG. 2 for a typical small signal JFET transistor is spread between 2 to 7 mA. Such a large spread usually means that the quiescent point of the transistor is difficult to adjust in a way suitable for production, usually the quiescent point of the JFET transistors must be trimmed manually.

In the inventive sound shaper for clean tube-like sound 4 a different way of adjusting the quiescent point for the transistor J2 is used. By use of the datasheet for the JFET transistor the spread of the saturation current 13 for a class of transistors can be studied and the spread in potential for the selected quiescent point can be estimated. The estimation is performed by a lateral displacement of the graph in the transfer characteristics to the different levels of saturation current 13. Thereby, the VGS potential for the selected quiescent point is obtained. The obtained potential variation for the quiescent point is denoted $\Delta VGS$. The mean value of the different VGS potentials is denoted $VGS_{mean}$, this mean value corresponds to the required mean potential needed to cause the desired quiescent point at 20% of the maximum drain current.

By solving the node equations for the JFET transistor J2 the drain current spread can be expressed as:

$$\Delta ID = ID \cdot \Delta VGS / (2 \cdot VS)$$

Inspection of the expression for the drain current spread, $\Delta ID$, gives that the potential of the source terminal, VS, have an effect on the drain current spread $\Delta ID$. A sufficiently large potential VS results in that the drain current spread due to different saturation currents of the JFET transistor J2 becomes negligible.

The impedance ZS2 is dimensioned by selecting a suitable potential on the source terminal VS, this potential is used for calculating ZS2=VS/ID.

The impedance ZD2 is dimensioned by causing a potential on the drain terminal corresponding to half of the available DC-level, which can be written as:

$$VD = (VDD2 + VS)/2$$

The impedance ZD2 is arranged between the supply voltage VDD2 and the drain terminal of the transistor J2 can easily be calculated as:

$$ZD2 = (VDD2 - VD)/ID$$

Such a dimensioning cause maximum dynamic for the output signal 5 with respect to the available supply voltage.

The bias stage 17 is most preferably dimensioned for applying a dc-level on the input signal 3 that is $VS-VGS_{mean}$, thereby the JFET transistor achieves the desired quiescent point.

By this dimensioning an adjustment that is insensitive to variations of the saturation current 13 of the JFET transistor J2 is achieved. Furthermore, this dimensioning guarantee that the quiescent point for the transistor J2 is always in the quadratic region, achieving a sound pleasant for the human ear.

Figure 4:
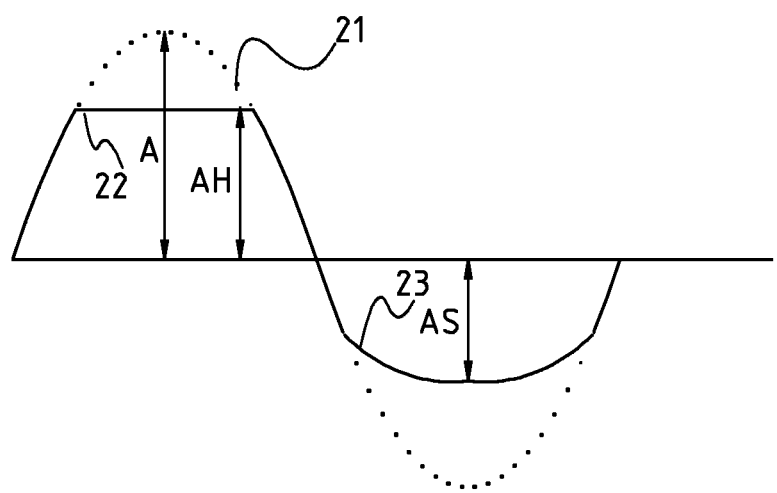
FIG. 4 illustrates in a diagram how a soft and a hard distorted sinusoidal signal look like in the time domain, respectively.

In FIG. 4 some of the important sound shaping features that a tube-like sound shaper should exhibit are illustrated, besides the previously discussed nonlinearities. First the so called hard distortion is illustrated by clipping an incoming sinusoidal wave 21 at a signal level AH that is below the maximum amplitude A to the waveform 22, whereby hard distortion is achieved. Hard clipping is normally achieved by overdriving an amplifier stage by means of a too large amplitude of the input signal thereof.

One of the more important properties of a tube-like sound shaper is the so called soft distortion of an input signal. In FIG. 4 a typical soft distorted waveform 23 formed from an incoming sinusoidal waveform 21 is disclosed.

Figure 5:
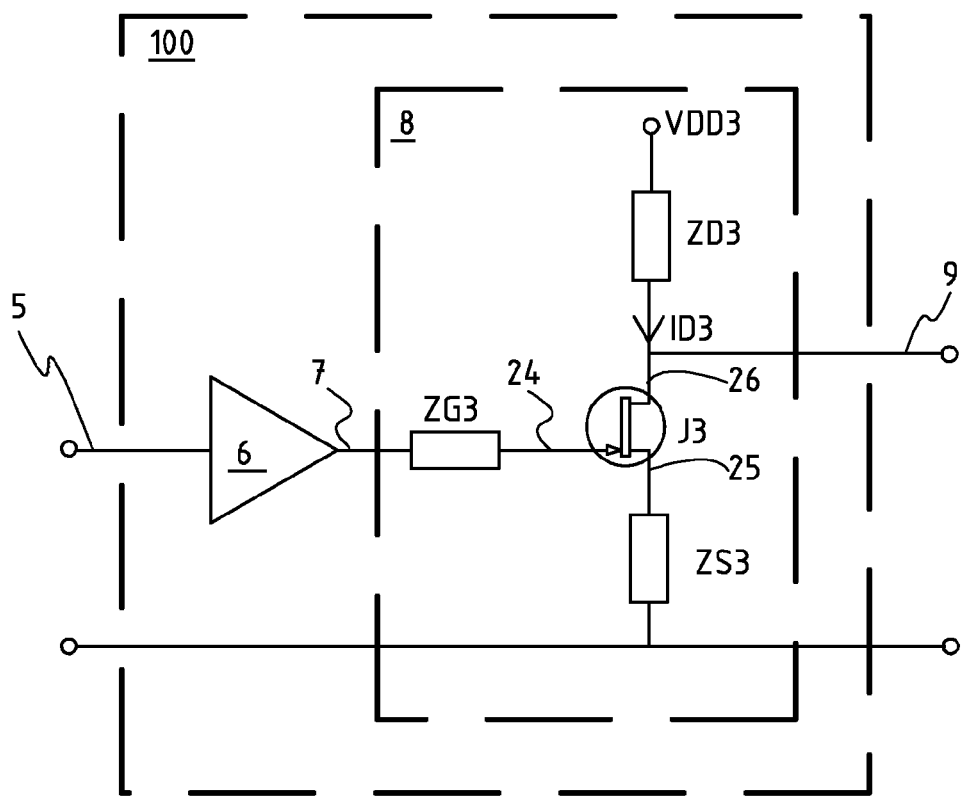
FIG. 5 shows schematically a sound shaping stage for hard and soft distorted tube-like sound, respectively.

FIG. 5 shows a sound shaping stage 100 according to the invention for soft and hard distortion of an incoming input signal 5. The incoming input signal 5 from the sound shaper for clean tube-like sound 4 is modified by the modifying means 6 by amplifying the amplitude and adjusting the DC-level of the signal, thereby forming the intermediate signal 7. The intermediate signal 7 is fed to the inventive sound shaping stage 8 for shaping the sound.

The sound shaping stage 8 comprises an impedance ZG3 arranged between the intermediate signal 7 and the gate terminal 24 of the JFET transistor J3. The sound shaping stage 8 is supplied with a supply voltage VDD3, which supply voltage is connected to the drain terminal 26 of the transistor via an impedance ZD3. The drain terminal 26 is further connected to the output terminal 9 of the sound shaper. The source terminal 25 is connected to ground potential via the impedance ZS3. Description of the method for dimensioning the parts of the sound shaper 8 is disclosed in detail below.

The quiescent point Q for the JFET transistor J3 in the inventive sound shaper is in the quadratic region QR of the transfer characteristics. Most preferably the drain current in the quiescent point is about 20% of the maximum drain current, which results in that the quiescent point is in the quadratic region QR. The adjustment of the quiescent point Q is performed by the same method as described earlier with reference to FIG. 3.

The impedances ZD3, ZS3 are dimensioned in the same way as described in connection with FIG. 3.

An amplitude of one of the half periods of the intermediate signal 7 that is sufficiently large to be below the threshold voltage 12 of the JFET transistor J3 causes the channel in the JFET transistor J3 to cut-off, wherein the drain current ID3 through the same achieves the minimum value thereof, in practice zero. By causing the transistor J3 to cut-off, the potential of the output signal 9 is brought to the maximum value thereof, wherein the output signal 9 is clipping 22. A similar clipping 22 of the output signal 9 is usually called hard clipping.

An amplitude of the second half period of the intermediate signal 7 that is sufficiently large to cause the potential between the gate terminal 25 and the source terminal 26 to a level that is above the built-in potential of the intrinsic gate source diode of the JFET transistor J3, which causes the gate source diode to start to conduct current. But the gate source diode of the transistor J3 is brought to conduct current in the forward direction the current will increase exponentially according to the diode equation, which causes a fast increase of the voltage drop over the impedance ZG3 while the potential over the gate-source diode of the transistor J3 increases marginally and is essentially limited to the built-in potential of the gate source diode. This limitation of the potential over the gate source diode causes a soft limitation of the output signal 9 causing a soft distortion 23 to arise. The impedance ZG3 that is connected to the gate terminal 24 of the JFET transistor J3 is dimensioned for a small current into the gate terminal 24 and is typically a few hundreds of thousand ohms.

Figure 6:
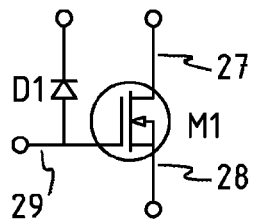
FIG. 6 shows an alternative embodiment with a MOSFET transistor.

In another embodiment according to FIG. 6 at least one of the JFET transistors J2,J3 have been replaced by at least one MOSFET transistor. The MOSFET transistor comprises one external diode D1 arranged at the gate terminal 29. In the case when the cathode of the diode D1 is connected to the source terminal 28 an identical function as with a JFET transistor is obtained. In other embodiments the cathode of the diode D1 can be connected to another potential.

Figure 7:
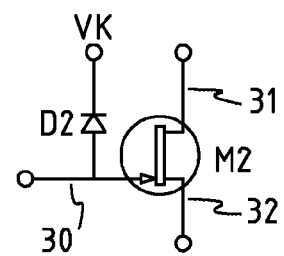
FIG. 7 shows an alternative embodiment with a JFET transistor and a diode arranged at the gate terminal thereof.

In yet another embodiment according to FIG. 7 at least one of the JFET transistors J2,J3 have been provided with an external diode D2 with the anode thereof connected to the gate terminal of said transistor J2,J3. Furthermore, the cathode of said diode is connected to a potential VK, which potential most preferably is lower than the potential of the source terminal of said transistor. This results in that the external diode D2 is brought to a potential above the built-in potential thereof at a lower voltage on the gate terminal than what is needed by the intrinsic diode of the JFET transistor to conduct current.

In one embodiment the potential VK is most preferably adjusted to a level causing the diode D2 to conduct at a potential equal to the difference between the threshold voltage 12 in FIG. 2 and the potential between the gate terminal and the source terminal in the quiescent point. The quiescent point Q will then be placed in the middle of the interval between the threshold voltage 12 and the potential between the gate terminal and the source terminal when the diode D2 starts to conduct current. Such a configuration implies that soft and hard distortion occurs symmetrically in the respective half period of a sinusoidal input signal.

In another embodiment the potential VK is adjusted to the level causing the most euphonious sound shaping.

Figure 8:
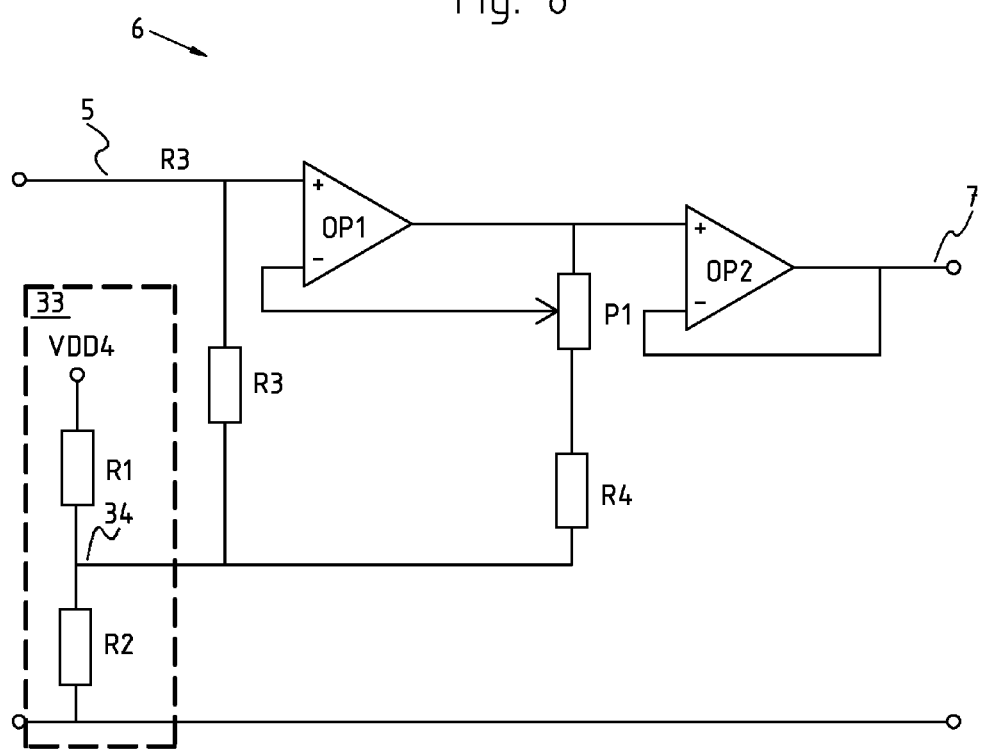
FIG. 8 shows an embodiment of a modifying means for amplification and adjustment of the DC level.

In FIG. 8 an example embodiment of a modifying means 6 for forming an intermediate signal 7 from the sound shaper input signal 5 is disclosed. The modifying means comprises two operational amplifiers OP1, OP2. The sound shaper input signal 5 is fed to a non-inverting input + of a first operational amplifier OP1, furthermore said sound shaper input signal 5 is connected via an impedance R3 to a potential 34 from a voltage divider 33 constituted by the impedances R1,R2 and the voltage VDD4. The output of the first operational amplifier OP1 is connected to the non-inverting input + of the second operational amplifier OP2 and via a potentiometer P1 and an impedance R4 to the output 34 of said voltage divider 33. The middle connector of the potentiometer P1 is connected to the inverting input (−) of the first operational amplifier OP1. The modifying means 6 applies a dc-level on the sound shaper input signal 5 determined by the output level 34 of the voltage divider 33, the amplification is adjusted by means of the potentiometer P1.

It shall be pointed out that the illustrated music system in FIG. 1 is only an example of a possible and meritorious application of the disclosed method for driving a field effect transistor for sound shaping.

The invention claimed is:

1. A method for driving a field effect transistor for forming an electric input signal, representing a sound, to an output signal, which method comprises modifying the input signal to an intermediate signal, and output of said intermediate signal to the field effect transistor for forming the output signal, characterized by the steps of:
    setting the quiescent point of the field effect transistor such that the same is placed in the quadratic region of a transfer characteristic of the field effect transistor by adjusting the potential between a gate terminal and a source terminal of the field effect transistor by means of the direct-current voltage level of the intermediate signal and the potential of the source terminal of the field effect transistor,
    adjusting the amplitude of the intermediate signal such that the same causes the potential swing between the gate terminal and the source terminal to at least partly be in the quadratic region of the transfer characteristics of the field effect transistor.

2. The method according to claim 1, wherein the amplitude of the intermediate signal is adjusted to be lower than the threshold voltage of the field effect transistor.

3. The method according to claim 1, wherein the method comprises the steps of:
    limiting the minimum potential between the drain terminal and the source terminal of the field effect transistor by means of at least one impedance arranged at at least the drain terminal thereof, which impedance causes that the maximum current that the field effect transistor can drive does not cause saturation of the transistor,
    arranging a resistor in series with the output of the modifying means and the gate terminal of the field effect transistor,
    adjusting the amplitude of the intermediate signal so that it causes the potential between the gate terminal and source terminal to a value that at least correspond to the maximum possible drain current.

4. The method according to claim 3, wherein the method comprises the step of:
    arranging a diode between the gate terminal of the field effect transistor and a potential.

5. A device for executing the method according to claim 1, for forming an electrical signal representing a sound, comprising a field effect transistor and an upstream connected modifying means, which device is characterized in that the quiescent point of the field effect transistor is in the quadratic region of the transfer characteristics of the field effect transistor, and the device further comprises means for controlling the potential between the gate terminal and the source terminal of the field effect transistor, by adding a direct-current voltage to the input signal by means of the modifying means, thus forming an intermediate signal, the modifying means outputs the intermediate signal to the field effect transistor.

6. The device according to claim 5, wherein the modifying means comprises means causing the amplitude of the intermediate signal to be lower than the threshold voltage of the field effect transistor.

7. The device according to claim 5, wherein the device comprises:
    at least one impedance provided at at least the drain terminal of the field effect transistor, which impedance causes a maximum drain current less than the maximum current of the saturated field effect transistor,
    a resistor in series between the output of the modifying means and the gate terminal of the field effect transistor,
    amplifying means in the modifying means for amplifying the intermediate signal to a value causing at least the maximum drain current.

8. The device according to claim 5, wherein the device comprises:
    a diode arranged between the gate terminal of the field effect transistor and a potential.

* * * * *